United States Patent [19]
Yap

[11] Patent Number: 5,138,626
[45] Date of Patent: Aug. 11, 1992

[54] RIDGE-WAVEGUIDE BURIED-HETEROSTRUCTURE LASER AND METHOD OF FABRICATION

[75] Inventor: Daniel Yap, Thousand Oaks, Calif.

[73] Assignee: Hughes Aircraft Company, Los Angeles, Calif.

[21] Appl. No.: 582,300

[22] Filed: Sep. 12, 1990

[51] Int. Cl.$^5$ .................................. H01S 3/19
[52] U.S. Cl. .................................. 372/46; 372/45; 372/50; 437/129
[58] Field of Search .............. 372/44, 45, 46, 50; 437/129

[56] References Cited

U.S. PATENT DOCUMENTS

| | | | |
|---|---|---|---|
| 4,731,789 | 3/1988 | Thornton | 372/45 |
| 4,802,182 | 1/1989 | Thornton et al. | 372/50 |
| 4,827,483 | 5/1989 | Fukuzawa et al. | 372/45 |
| 4,932,033 | 6/1990 | Miyazawa et al. | 372/46 |
| 4,990,466 | 2/1991 | Shieh et al. | 437/129 |
| 5,022,036 | 6/1991 | Suyama et al. | 372/45 |

FOREIGN PATENT DOCUMENTS

| | | |
|---|---|---|
| 57-63882 | 4/1982 | Japan . |
| 61-251090 | 11/1986 | Japan . |
| 61-296783 | 12/1986 | Japan . |

OTHER PUBLICATIONS

Anderson et al., "Compositional Disordering of GaAs/AlGaAs Multiple Quantum Wells Using Ion Bombardment at Elevated Temperatures", Appl. Phys. Lett. 53(17), pp. 1632-1634, Oct. 24, 1988.
Kaminow et al., "Low-Threshold InGaAsP Ridge Waveguide Lasers at 1.3 μm", IEEE Journal of Quantum Electronics, vol. QE-19, No. 8, pp. 1312-1318, Aug. 1983.
Meehan et al., "Stripe-Geometry AlGaAs-GaAs Quantum-Well Heterostructure Lasers Defined by Impurity-Induced Layer Disordering", Apply. Phys. Lett. 44(7), pp. 700-702, Apr. 1, 1984.
Fukuzawa et al., "GaAlAs Buried Multiquantum Well Lasers Fabricated by Diffusion-Induced Disordering", Apply. Phys. Lett. 45(1), pp. 1-3, Jul. 1, 1984.
Introduction to Semiconductor Technology: GaAs and Related Compounds, Edited by Cheng T. Wang, John Wiley & Sons, pp. 512-535, Jan. 1990.
O. Wada et al., "Very Low Threshold Current Ridge-Waveguide AlGaAs/GaAs Single-Quantum-Well Lasers", Electronics Letters, vol. 21, No. 22, Oct. 24, 1985, pp. 1025-1026.
H. D. Wolf et al., "High-Speed AlGaAs/GaAs Multiple Quantum Well Ridge Waveguide Lasers", Electronics Letters, vol. 25, No. 13, Aug. 31, 1989, pp. 1245-1246.

*Primary Examiner*—Georgia Y. Epps
*Attorney, Agent, or Firm*—V. D. Duraiswamy; W. K. Denson-Low

[57] ABSTRACT

A laser structure achieves high reliability, good bandwidth and performance characteristics and a fabrication procedure that is compatible with other IC devices by providing an active lasing region below an optical mode confining ridge. The active region is preferably a multiple quantum well (MQW) that is sandwiched between upper and lower cladding layers. The portions of the MQW lateral to the ridge are compositionally disordered to give them a larger bandgap energy and lower refractive index than the active MQW region, and thus resist charge carrier spreading from the MQW. The ridge provides the primary optical mode confinement, allowing a shallow burial of the MQW to a depth less than 0.5 microns. This permits the compositional disordering of the lateral MQW regions to be performed by a heated ion implantation process that requires a lower temperature than separate implantation and annealing, and is compatible with the provision of additional circuitry on the same substrate.

22 Claims, 4 Drawing Sheets

RIDGE-WAVEGUIDE BURIED-HETEROSTRUCTURE LASER AND METHOD OF FABRICATION

BACKGROUND OF THE INVENTION

1. Field of the Invention

This invention relates to lasers, and more particularly to ridge-waveguide and buried-heterostructure lasers.

2. Description of the Related Art

Lasers with low threshold currents, high output powers in a single spatial mode and large modulation bandwidths are required for optical communications applications. In addition, it is often desirable to monolithically integrate the lasers on the same substrate with electronic signal processing and driver circuitry.

One type of device that has been of interest for this purpose is the ridge-waveguide laser. These devices were reported in I. P. Kaminow et al., "Low-Threshold InGaAsP Ridge Waveguide Lasers at 1.3 μm", *IEEE Journal of Quantum Electronics*, Vol. QE-19, No. 8, pages 1312–1318, August 1983, and are now quite common.

A ridge-waveguide laser is illustrated in FIG. 1. The device is fabricated on a semiconductor substrate 2 such as InP. A ridge 4 is etched over the substrate for current channeling and optical-mode confinement in the laser. The optical mode is indicated by the dashed line circle 5. With the earlier devices, a generally homogeneous active layer 6 of lasing material, such as InGaAsP, is buried beneath the ridge and extends laterally to either side of the ridge. An upper cladding layer 8 is located above the active layer 6 and includes the ridge 4, while a lower cladding layer 10 separates the active layer 6 from the substrate 2. The two cladding layers and the ridge are formed from a material having a higher bandgap energy than in the active layer 6, and accordingly work to confine charge carriers in the active layer. The cladding material could also be InGaAsP, but with a different percentage mix of the various components than in the active layer to provide the cladding layers with the required greater bandgap energy. For the ridge to successfully perform its current channeling and optical-mode confinement functions, the upper cladding layer 8 between the ridge and the active layer is quite thin, generally on the order of 0.2–0.3 microns or less. Lateral current spreading into the regions on either side of the ridge is reduced by the thin cladding layers, while optical-mode confinement is obtained by the effective refractive index step due to the ridge.

More recently, ridge-waveguide lasers have used multiple quantum wells (MQWs) or single quantum wells (SQWs) as the active lasing medium instead of a thicker homogeneous active medium. These types of devices are discussed in O. Wada et al, "Very Low Threshold Current Ridge-Waveguide AlGaAs/GaAs Single-Quantum-Well Lasers", *Electronics Letters*, Vol. 21, No. 22, Oct. 24, 1985, pages 1025–1026, and H. D. Wolf et al., "High-Speed AlGaAs/GaAs Multiple Quantum Well Ridge Waveguide Lasers", *Electronics Letters*, Vol. 25, No. 13, Aug. 31, 1989, pages 1245–1246.

Ridge-waveguide lasers have yielded reliable performance and their fabrication is relatively simple; the lasers can be fabricated together with other electronic devices on the same chip. However, the performance of ridge-waveguide lasers is limited by current spreading in the active area lateral to the ridge. Such current spreading is indicated by arrows 12 in FIG. 1. In addition to this current spreading and a consequent loss of power and efficiency, ridge-waveguide lasers are limited to a modulation bandwidth less than 15 GHz, whereas certain radar and communications applications require higher modulation rates.

Another approach to lasers for communications applications is the buried-heterostructure laser. In these lasers, the active region is surrounded in both the vertical and lateral directions by cladding material of greater bandgap energy. The lateral cladding material is typically formed in a separate material growth step. However, it can also be formed from the originally grown material by compositional disordering. Compositionally disordered buried heterostructure lasers are discussed in K. Meehan et al., "Stripe-Geometry AlGaAs-GaAs Quantum-Well Heterostructure Lasers Defined by Impurity-Induced Layer Disordering", *Applied Physics Letters*, Vol. 44, No. 7, pages 700–702, Apr. 1, 1984, and T. Fukuzawa, "GaAlAs Buried-Multiquantum Well Lasers Fabricated by Diffusion-Induced Disordering", *Applied Physics Letters*, Vol. 45, No. 1, pages 1–3, Jul. 1, 1984, and are illustrated in FIG. 2. The device is formed on a semiconductor substrate 14, and involves a buried heterostructure in the form of an MQW 16 that is sandwiched between upper and lower cladding layers 18 and 20. As initially formed, the MQW extends laterally across the width of the section shown in FIG. 2. However, the lateral portions 22 and 24 of the MQW are compositionally disordered to intermix the quantum well material with the intervening barrier layers, resulting in an interdiffused material having a higher bandgap energy ($E_g$) than the original quantum well material, and a lower refractive index. This effectively prevents lateral current spreading from the remaining central portion of the MQW 16 shown in FIG. 2.

The basic MQW structure is well known and is illustrated in FIG. 3a, with the corresponding electron energy bands shown in FIG. 3b (the MQW structure illustrated in FIG. 3a is rotated 90° from that in FIG. 2). The MQW structure consists of alternating layers of III-V compound semiconductor quantum wells 26 and barrier 28s; the total number of wells for laser applications typically ranges from one to about ten. The material selected for the wells 26 has a significantly lower $E_g$ (energy difference between the conductance and valence bands) than does the material selected for the barrier layers 28. A guiding principle for such heterostructures is the choice of a particular fundamental bandgap $E_g$, and consequently an optical absorption edge, by the deliberate choice of the material parameters. At the heterojunctions the conduction band and the valence band have discontinuities, while the Fermi level coincides on both sides of the junction. Because of such discontinuities, the energy bands near the heterojunction interfaces are bent and local electric fields are created on each side of the junction. Such band discontinuities are utilized for carrier confinement in semiconductor lasers. A more detailed description of MQWs and their application to guided-wave devices is provided in *Introduction to Semiconductor Technology: GaAs and Related Compounds*, edited by C. Wang, John Wiley & Sons, pages 512–535, 1990. Typical well materials are GaAs and InGaAs, while corresponding barrier materials are AlGaAs and InGaAsP.

If the barrier material is totally interdiffused with the well material of the MQW, the result is a third material that has a higher $E_g$ than the well, but somewhat lower than that of the barrier; the exact level depends upon the relative amounts of each material in the original MQW. This results in the lateral portions 22 and 24 of the original MQW being converted to confinement layers after intermixing, which serve to confine the current to the active lasing region 16. The increase in $E_g$ for the mixed material relative to the well is accompanied by a reduction in the refractive index, again relative to the well, thereby also increasing the optical-mode confinement.

The compositional disordering of the lateral MQW sections may be achieved by various techniques. Originally, zinc was diffused as an impurity into the device over the desired lateral MQW sections, down to a depth at least as great as that of the MQW. This diffusion, indicated by diagonal stripes in FIG. 2, was found to disorder the portion of the MQW into which it extended. Other techniques were subsequently developed, including the diffusion of other dopants or vacancies, and the implantation of various ions to achieve disordering. In the resulting buried heterostructure lasers, carrier and optical-mode confinement in the direction perpendicular to the epitaxial layers is provided by the cladding layers 18 and 20, while carrier and optical-mode confinement in the lateral direction (in the plane of the layers) are provided by the larger bandgap and lower refractive index of the disordered material relative to the well material. The lower refractive index results from the higher concentration of free carriers (from the dopant diffusion or the implantation), and from the absence of the quantum-well effect.

While implantation is mentioned as a possible way to achieve the desired disordering, it is not very practical because of the very high energies required. The active lasing layer (MQW) is buried relatively deep, typically about 1.5 microns. Implantation energies greater than 1 MeV are required to implant to this depth, so diffusion is normally employed. Diffusion, on the other hand, is normally isotropic and spreads laterally, making it difficult to control.

The buried heterostructure laser generally provides better performance than ridge-waveguide lasers, since the active region is enclosed on all sides by larger bandgap energy material. They have a greater bandwidth, which can exceed 15 GHz. On the other hand, buried heterostructure devices are generally less reliable than ridge-waveguide lasers. Although one buried heterostructure device, referred to as the buried-crescent design, exhibits better reliability, its fabrication requires growth by liquid-phase epitaxy and is thus limited by smaller wafer sizes and non-uniformity problems.

The fabrication of buried heterostructure lasers is quite complicated and usually requires several growth steps. As a result, the integration of such lasers with integrated circuit electronics on the same wafer is difficult, and often involves selective area growths. Furthermore, in buried heterostructure lasers formed by compositional disordering the wafer must be heated during diffusion of the dopant that causes the MQW disordering, typically to about 600°–700° C. for a diffusion of zinc, and about 900° C. for a diffusion of silicon into GaAs based materials. These temperatures can spoil certain integrated circuit devices already on the wafer, such as modulation doped transistors, and is another reason why the formation of the laser in the same process with other electronics is normally not done. If implantation is attempted, high temperatures in excess of 800° C. for GaAs based materials are subsequently required to anneal the implant.

Compositional disordering of MQWs using ion implantation at significantly lower temperatures has been reported in a separate context in Anderson et al., "Compositional Disordering of GaAs/AlGaAs Multiple Quantum Wells Using Ion Bombardment at Elevated Temperatures", *Applied Physics Letters*, Vol. 53, No. 17, pages 1632–1634, Oct. 24, 1988. Disordering of the MQW is achieved by implanting ions into MQW substrates that have been heated to temperatures of 400°–700° C. This simultaneous implantation and annealing allows the temperature to be significantly less than the temperatures required for diffusion or separate annealing. Non-dopant ions can be used, which reduces free-carrier absorption and thus leads to lower threshold currents and higher efficiencies. However, the depth of the active region in the buried heterostructure laser, and the corresponding very high energies necessary to implant to this depth, have made the Anderson et al. technique inapplicable to buried heterostructure lasers on a practical basis.

SUMMARY OF THE INVENTION

The present invention seeks to provide an improved laser structure that achieves the high reliability, easy fabrication and compatibility with other integrated circuit devices of ridge-waveguide lasers and the better performance of the buried heterostructure devices, without suffering from the limitations discussed above for either type of device.

The new laser structure is formed by fabricating a ridge-waveguide laser having a region of active lasing material buried within a current confining material below an optical mode confining ridge, and compositionally disordering the portion of the active region lateral to the ridge to give it a larger bandgap and a lower refractive index than the remainder of the active region which is aligned under the ridge. The disordered lateral portions provide lateral charge carrier confinement to the remaining active region, while vertical charge carrier confinement is provided by the current confining material above and below the active region.

In a preferred embodiment, the active region is buried less than about 0.5 microns, and preferably about 0.2–0.3 microns, below the ridge. The active region consists of an MQW or a SQW, with the disordered regions of the quantum well structure having the quantum well and barrier layers at least partially intermixed.

The compositional disordering of the lateral active region portions is preferably accomplished by implanting ions into these regions while heating the laser structure to a temperature of less than the threshold of temperature degradation for the material. This permits the material for additional circuit devices to be formed on the same substrate with the laser prior to the implantation/heating step.

Further features and advantages of the invention will be apparent to those skilled in the art from the following detailed description, taken together with the accompanying drawings, in which:

DETAILED DESCRIPTION OF THE INVENTION

The present invention is based upon a modification of a form of ridge-waveguide laser. A quantum well structure is used for the active region, and the portions of the structure lateral to the ridge are compositionally disordered to provide lateral confinement for the remaining active region under the ridge.

Figure 1:
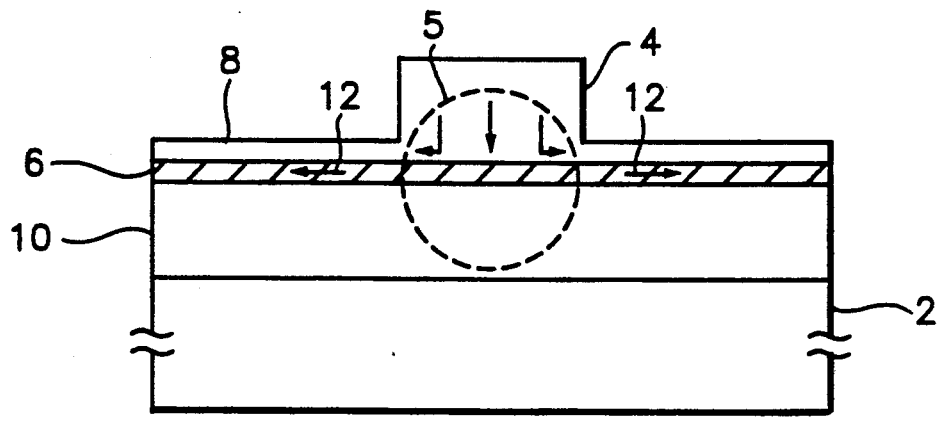
FIG. 1 is a sectional view of a prior ridge-waveguide laser, discussed above.
Figure 2:
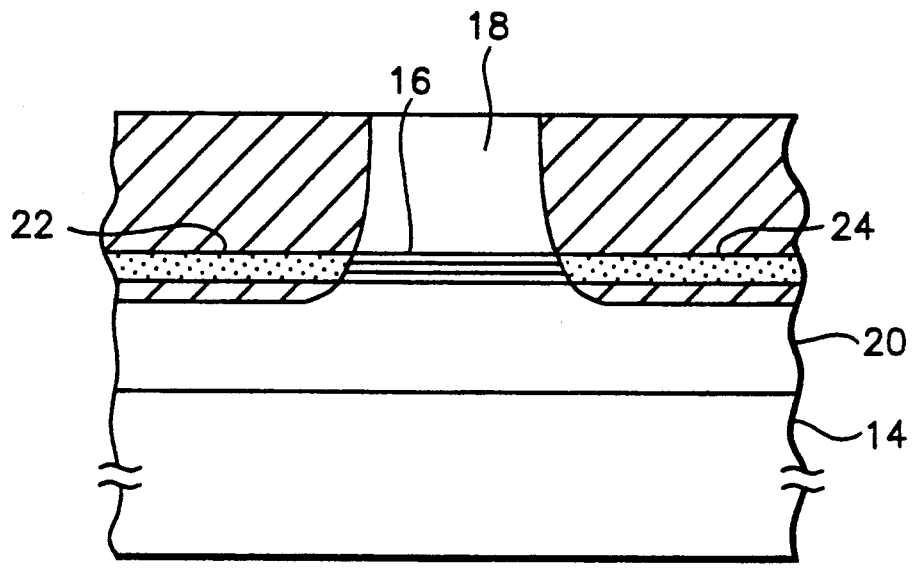
FIG. 2 is a sectional view of a prior buried heterostructure laser, discussed above.
Figure 3A:
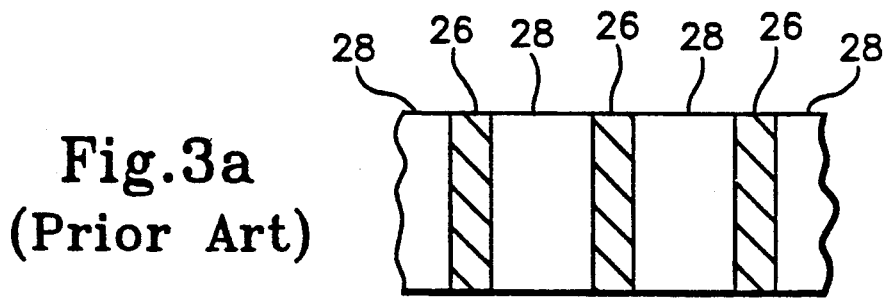
FIGS. 3a and 3b are respectively fragmentary sectional views and electron energy diagrams of an MQW, discussed above.
Figure 3B:
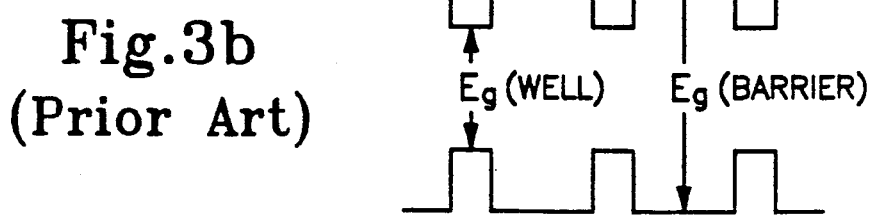
Figure 4:
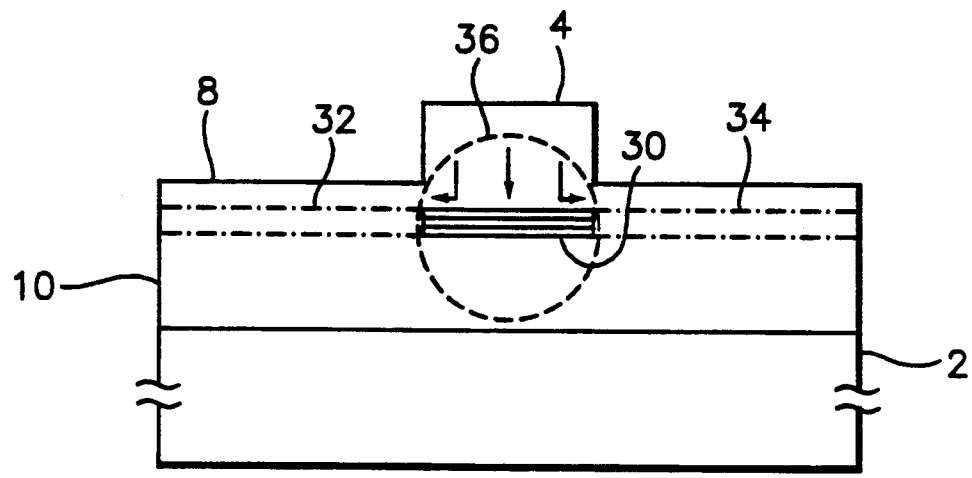
FIG. 4 is a sectional view of a new laser structure in accordance with the invention.

A sectional view of the new laser structure is provided in FIG. 4. Elements of the structure which are common to the conventional ridge-waveguide laser of FIG. 1 are indicated by the same reference numerals. An MQW 30 is sandwiched between upper and lower cladding layers 8 and 10, and is aligned with the lateral bounds of a mesa ridge 4. MQW 30 is initially formed as a continuous layer below upper cladding layer 8, but its lateral sections 32, 34 on either side of ridge 4 are compositionally disordered to give them a higher $E_g$ and lower refractive index than the active lasing medium immediately below the ridge (the quantum wells of MQW 30). The larger bandgap of the disordered material provides lateral charge carrier confinement for active region 30, while the lower refractive index of the disordered material provides a degree of lateral optical mode confinement. The optical mode is defined principally by the lateral dimension of ridge 4, and is indicated by dashed circle 36.

As with prior ridge-waveguide lasers, the active region as originally formed is less than about 0.5 microns below the surface of upper cladding layer 8; it is preferably 0.2-0.3 microns deep or less to reduce lateral current spreading in the upper cladding layer. However, the provision of ridge 4 immediately above the active region 30 gives the active region an effective buried depth equivalent to that of prior buried heterostructure lasers.

There is a fairly wide range of choice of materials for the MQW. In general, the electron energy of the barrier material should exceed that of the well material by enough so that the electron energy differential between the intermixed regions 32, 34 and the adjacent well material exceeds the electron kinetic energy at room temperature (about 25 meV), thus confining free electrons to the wells. The relative thicknesses of the wells and barrier layers will also play a role, since the electron energy of the intermixed region will depend upon the relative amounts of well and barrier material present prior to intermixing. For example, if GaAs is employed for the well and AlGaAs for the barrier material, the electron energy of the barriers will generally increase with an increasing percentage of aluminum. With a relatively high aluminum content of about 30-50%, typical well and barrier thicknesses are on the order of about 100 Angstroms, and the exact dimensions will not be critical for achieving the desired electron energy differential. However, if the quantum wells are made very thin, on the order of perhaps 20 Angstroms, then the confined electron energies in the well are so much greater than the minimum conduction band energy that they may exceed the initial barrier level, and thus overcome the confinement. A minimum well thickness must thus be observed. If, on the other hand, the aluminum content in the barriers is only about 10%, then the barrier electron energy will be much closer to that in the wells. The relative well and barrier dimensions then become more important, and the barrier layers must be sufficiently wide relative to the wells that the aluminum content of the intermixed material is high enough to achieve the required energy differential.

Figure 5A:
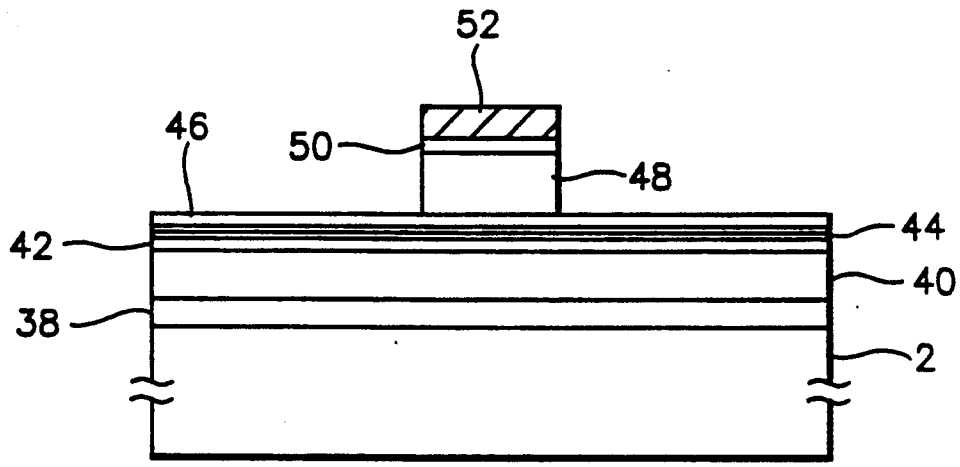
FIGS. 5a, 5b and 5c are sectional views illustrating successive steps in the fabrication of the laser.
Figure 5B:
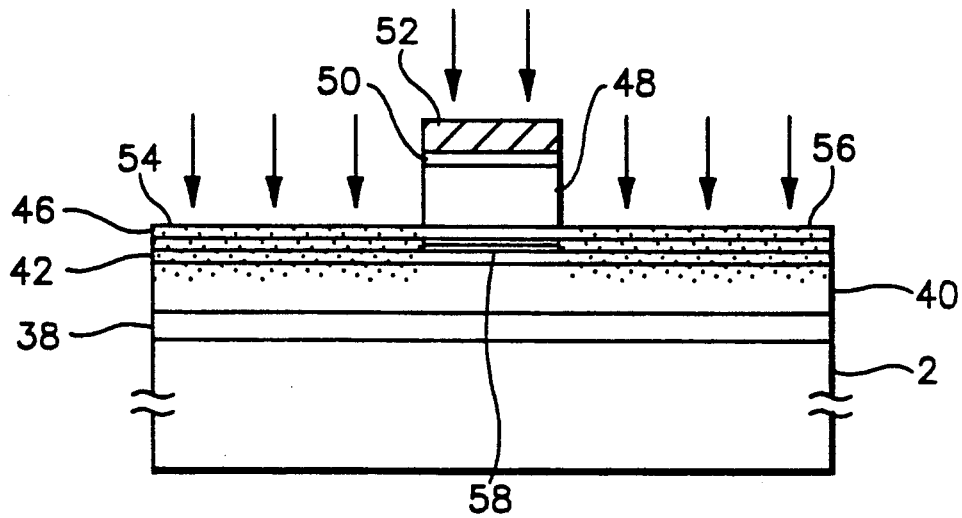
Figure 5C:
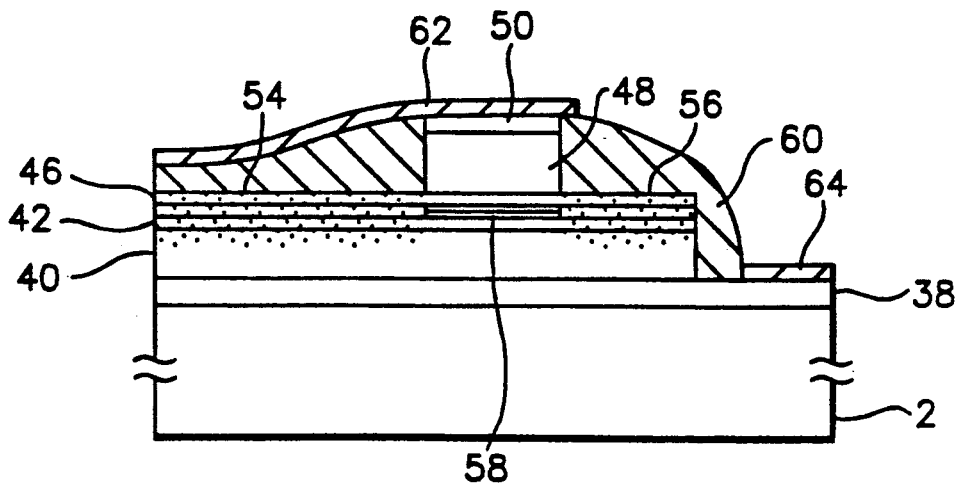

FIGS. 5a-5c illustrate a preferred fabrication technique for the new laser. Although the laser design and the general fabrication process is applicable to many types of laser materials of various lasing wavelengths, a laser based upon AlGaAs/GaAs will be described.

First, the appropriate laser epitaxial layers are grown. A variety of epitaxial deposition techniques are available for this purpose, such as liquid phase epitaxy (LPE), molecular beam epitaxy (MBE), organo-metallic vapor phase epitaxy (OMVPE), or organo-metallic molecular beam epitaxy (MOMBE). For higher modulation bandwidths, the layers can be grown on a semi-insulating GaAs substrate 2 on which is first grown an N+ GaAs contact layer 38.

In the present example, the epitaxial layers consist of an N− AlGaAs lower cladding layer 40, an N− graded AlGaAs lower separate confinement layer 42, an MQW region 44 of alternating AlGaAs barrier and GaAs well layers, a P− graded AlGaAs upper separate confinement layer 46, a ridge-shaped P− AlGaAs upper cladding layer 48, and a P+ GaAs upper contact layer 50. The ridge 48 and upper contact layer 50 are originally fabricated as layers which extend across the entire width of the device, but are capped by a patterned etch mask 52 to enable the upper cladding and contact material external to the ridge to be etched away. The etch mask stripe 52 is typically several microns wide, and the epitaxial material is etched by wet-chemical or dry etching techniques.

The provision of separate confinement layers 42 and 46, in addition to the lower and upper cladding layers 40 and 48, helps to concentrate the laser light in the active region. The cladding layers 40, 48 have a higher concentration of aluminum, typically about 40-80%, than do separate confining layers 42, 46, in which the aluminum component is typically about 20-40%. The cladding layers thus have a higher electron energy and lower refractive index than the separate confinement layers. The aluminum content in the separate confinement layers is preferably graded from a low value near the MQW to a higher value near the cladding layers. This creates an electric field which draws charge carriers into the active region, and improves the device efficiency because more carriers are converted into photons.

After formation of the ridge, the portions of the MQW lateral to the ridge are compositionally interdiffused by either the diffusion of an impurity such as zinc into these portions of the MQW, or by the implantation of various ions. This step is illustrated in FIG. 5b. The preferred technique is ion implantation while the device is heated to a temperature of several hundred degrees Centigrade. The implantation temperature should be lower than that which would degrade the performance of other devices that may be integrated on the same substrate. This temperature depends upon the type of material used. It is approximately 600°–800° C. for GaAs, and 450°–600° C. for InP. The preferred implantation temperature is about 500°–550° C. for GaAs, and about 400° C. for InP. Either the etch mask or the ridge itself may be used as an implantation mask. For an MQW buried about 0.2–0.3 microns below the surface of the upper separate confinement layer 46, implantation is performed at an energy of about 100–300 keV, with a dose in the range of about $10^{14}$–$10^{17}$ ions/cm$^2$; the exact energy and dose depend upon the implantation ion used as well as the implantation temperature. This technique allows non-dopant ions such as Ne to be employed in place of dopant ions such as Si, although the technique can also be used with dopant ions. The advantage of implanting non-dopant ions is that inert gases do not produce light absorbing charge carriers. The use of non-dopant ions to reduce free-carrier absorption leads to lower threshold currents and higher efficiency.

Since implantation and annealing are performed simultaneously, intermixing of the MQW layers can be achieved at much lower temperatures than those required for diffusion or separate annealing of an ion implant. Furthermore, it avoids the lateral spreading exhibited by a diffusion, along with the accompanying undesirable layer intermixing in the unimplanted regions of the MQW. The MQW is buried to a much shallower depth than with prior buried heterostructure lasers, so the impractically high implantation energies that would be required for such devices are also avoided.

A result of the implantation is an intermixing of the well and barrier layers in the portions 54, 56 of the MQW that are lateral to the ridge 48. The remaining active region 58 is centered below the ridge, which provides the primary optical-mode confinement by virtue of its effective refractive index step. Since the compositionally disordered regions 54, 56 have a larger $E_g$ than the quantum well material in the remaining MQW region 58, carriers are confined within the MQW under the ridge, which further lowers the threshold current and improves the efficiency and bandwidth. While the intermixed AlGaAs material has a slightly lower refractive index than the MQW material, optical-mode confinement is provided primarily by the etched ridge.

To complete the device, the ridge is planarized with a polyimide coating 60, a P-type contact 62 is deposited over the ridge, and an N-type contact 64 is deposited on the N+ contact layer 38. Both contacts are formed on the upper side of the wafer, since the substrate is semi-insulating.

Rather than employing an MQW for the active region, a SQW could also be used. In general, a single layer of smaller bandgap material sandwiched by cladding (barrier) layers is considered a quantum well if the well layer is no more than about 200 Å thick. Although somewhat thicker layers of well material could at least theoretically be used to implement the present invention, it would require excessive processing in terms of temperature, implant dose and/or time. A thickness of about 200 Angstroms will generally be only partially compositionally disordered for reasonable processing procedures, but the partial disordering may provide adequate lateral confinement.

Figure 6:
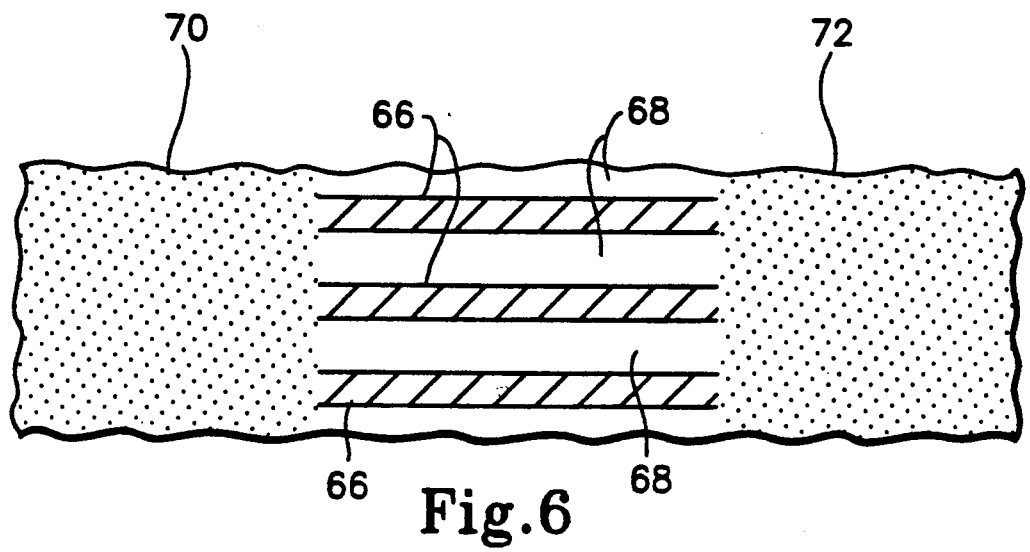
FIGS. 6 and 7 are sectional views respectively showing total and partial disordering of an MQW to form the active lasing region of the device.

FIG. 6 is a greatly enlarged fragmentary sectional view, not to scale, illustrating complete compositional disordering of the lateral MQW regions. The MQW is shown with quantum well layers 66 alternating with barrier layers 68. The lateral portions 70, 72 of the structure are assumed to have originally been part of the MQW, but have been fully compositionally disordered in accordance with the invention. They consist of homogeneous intermixtures of the quantum well and barrier material, with the percentage of each component determined by the relative amounts of well and barrier materials in the original MQW.

It is also possible to obtain a workable device with only a partial intermixing of the well and barrier materials. In general, higher implantation temperatures and perhaps longer implantation periods are required to obtain a complete compositional disordering. Only a partial intermixing will generally be achieved at an implantation temperature of 500° C.

Figure 7:
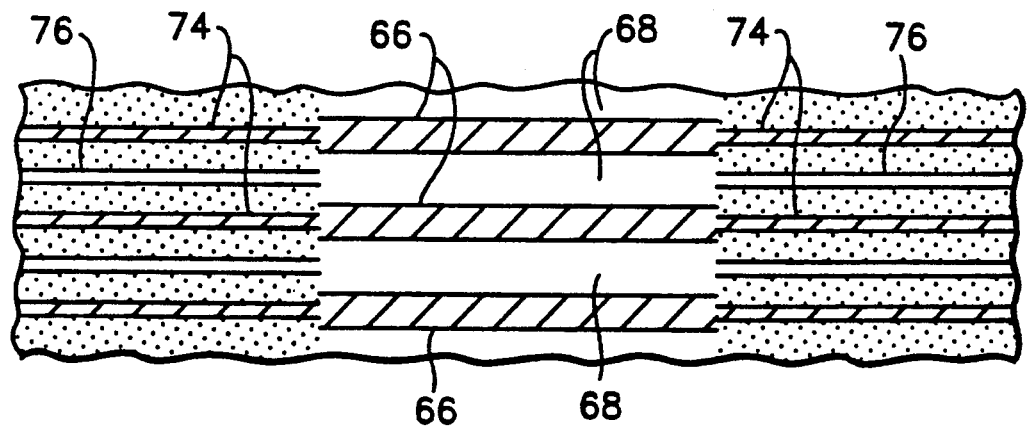

A partial intermixing is illustrated in FIG. 7. In the lateral areas where implantation has taken place, the barrier layers have intermixed with the upper and lower portions of the well layers, leaving narrowed strips of unintermixed well material 74 and barrier material 76. Although the interfaces between the intermixed material and the remaining well and barrier layers 74, 76 lateral to the MQW are illustrated as abrupt discontinuities, in reality they are graded transitions. If sufficient material has been intermixed, the $E_g$ will also increase in the remaining well layers 74. Together with the narrowing of the layers themselves, this helps to confine the current to the MQW well 66, although to a somewhat lesser extent than if the lateral well and barrier layers had been completely intermixed.

Figure 8:
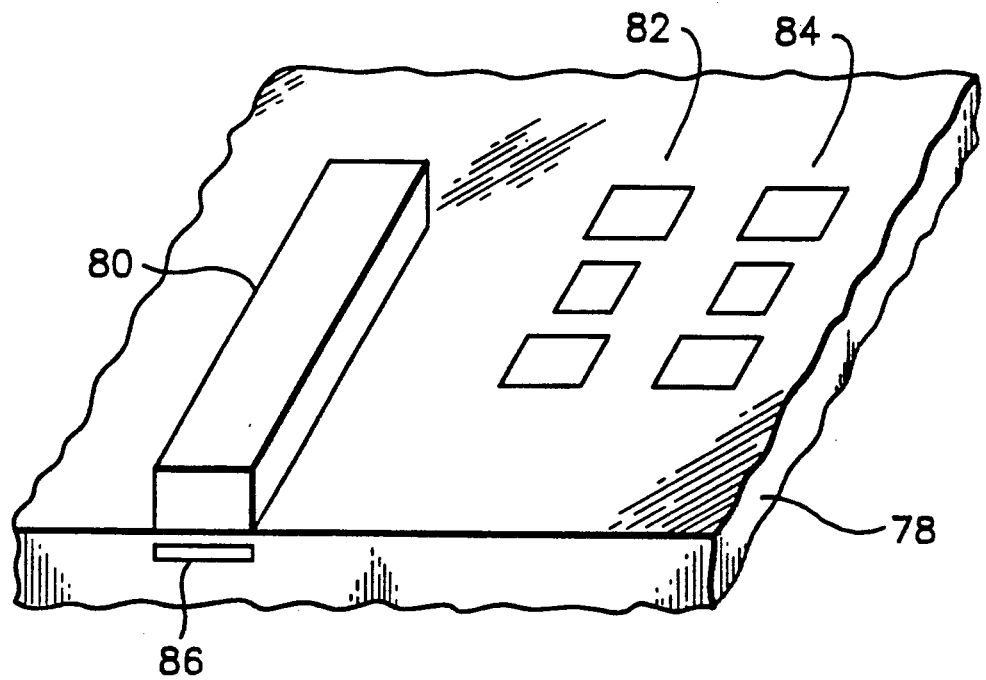
FIG. 8 is a fragmentary perspective view of a semiconductor wafer bearing both the new laser structure and integrated circuitry that has been fabricated along with the laser.

One of the distinct advantages of the invention is that its relatively low fabrication temperatures allow the laser to be integrated with other IC devices, such as modulation-doped transistors, whose performance could be degraded by higher processing temperatures. A portion of a completed wafer 78, illustrated in very simplified form, is shown in FIG. 8. The ridge 80 of a laser fabricated in accordance with the invention is shown on the wafer near other IC devices, such as transistors 82 and 84. The other IC devices are preferably formed in the same or similar epitaxial deposition and etch steps as the laser. The only additional fabrication step required for the laser would generally be the disordering implantation.

The front face 86 and rear face (not shown) of the laser are normally cleaved along a crystal axis mirror plane to obtain the necessary reflectivity for lasing action. The opposed laser faces might also be coated with various materials to increase their reflectivity, but the MQW laser material is fairly high gain and does not require a great amount of reflectivity; the refractive index differential between the MQW and the ambient atmosphere normally provides sufficient reflectivity. As an alternate or in addition to cleaving along the crystal axis, the MQW might also be subjected to a plasma etch to obtain a flat reflective face.

The new laser structure provides both the high reliability of ridge-waveguide lasers and the lateral current confinement and superior performance of prior buried heterostructure lasers. The use of a ridge for primary optical mode confinement allows the MQW to be buried to a much shallower depth than prior buried heterostructure devices, thus making it practical to fabricate the device with the heated implantation process that makes it compatible with the simultaneous fabrication of other IC devices on the same substrate.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

I claim:

1. A laser structure, comprising:
   a substrate;
   lower and upper charge carrier confining layers on said substrate,
   said upper confining layer including an upstanding ridge that defines a refractive index differential between the upper confining layer within the lateral boundaries of said ridge and the upper confining layer lateral to said ridge,
   a region of active lasing material sandwiched between said confining layers and located below said ridge and aligned substantially with the lateral bounds of said ridge, said ridge and its associated refractive index differential establishing a lateral optical confinement for said region of active lasing material, said region of active lasing material being buried less than about 0.5 microns below the top surface of said upper confining layer lateral to said ridge, and
   regions of compositionally disordered active lasing material laterally bounding said active region, said disordered regions having a larger bandgap energy and lower refractive index than said active region to resist lateral charge carrier and optical energy spreading therefrom.

2. The laser structure of claim 1, wherein said active region is buried about 0.2–0.3 microns below the top surface of said upper confining layer.

3. The laser structure of claim 1, said ridge being formed of the same type of material as said confining layers.

4. The laser structure of claim 1, said lower confining layer comprising a first cladding layer surmounted by a first separate charge carrier confinement layer, both of the same conductivity, said ridge and said upper confining layer respectively comprising a second cladding layer and a second separate charge carrier confinement layer, both of opposite conductivity to said first cladding and separate charge carrier confinement layers, said separate charge carrier confinement layers having intermediate refractive indices between the refractive indexes of said active region and said cladding layers.

5. The laser structure of claim 1, said active region comprising a multiple quantum well (MQW) having alternating quantum well and barrier layers, and said disordered region comprising lateral extensions of said MQW with their quantum well and barrier layers at least partially intermixed.

6. The laser structure of claim 1, said active region comprising a single quantum well (SQW) having a quantum well layer sandwiched between barrier layers, and said disordered region comprising lateral extensions of said SQW with their quantum well and barrier layers at least partially intermixed.

7. The laser structure of claim 1, said regions of disordered active material comprising lateral extensions of said active lasing material that are at least partially intermixed with said lower and upper confining layers.

8. The laser structure of claim 1, further comprising respective layers of contact material contacting the upper surface of said ridge and the lower surface of said lower confining layer.

9. A laser structure, comprising:
   a ridge-waveguide laser having a region of active lasing material buried within a charge carrier confining material below and generally aligned with a ridge that defines a refractive index differential between the charge carrier confining material immediately below said ridge and the charge carrier confining material lower than, and lateral to said ridge, said ridge and its associated refractive index differential establishing a lateral optical confinement for said region of active lasing material
   wherein the portion of said active region generally lateral to said ridge has a disordered structure to give it a larger bandgap energy and a lower refractive index than the remainder of said active region which is generally aligned with said ridge, and thereby provide lateral charge carrier and additional optical confinement for said remaining active region.

10. The laser structure of claim 9, wherein said remaining active region is buried less than about 0.5 microns below the base of said ridge.

11. The laser structure of claim 10, wherein said remaining active region is buried about 0.2–0.3 microns below the base of said ridge.

12. The laser structure of claim 9, said active region comprising a multiple quantum well (MQW) having alternating quantum well and barrier layers, and said disordered region comprising lateral extensions of said MQW with their quantum well and barrier layers at least partially intermixed.

13. The laser structure of claim 9, said active region comprising a single quantum well (SQW) having a quantum well layer sandwiched between barrier layers, and said disordered region comprising lateral extensions of said SQW with their quantum well and barrier layers at least partially intermixed.

14. The laser structure of claim 9, said regions of disordered active material comprising lateral extensions of said active lasing material that are at least partially intermixed with said lower and upper confining layers.

15. A method of forming a laser, comprising:
   providing a ridge-waveguide laser structure with a region of active lasing material buried within a charge carrier confining material, said confining material including an upstanding ridge, said ridge defining a refractive index differential between said charge confining material within the lateral boundaries of said ridge and the charge carrier confining material lateral to said ridge, said ridge and said refractive index differential establishing a lateral optical confinement for said region of active lasing material, said active region extending beyond the lateral bounds of said ridge, and
   compositionally disordering the portions of said active region which extend generally beyond the lateral bounds of said ridge by electric field-accelerated-ion implantation into said lateral active region portions, and simultaneously with said implantation heating said laser structure to an ion annealing temperature less than the threshold for temperature degradation of the material from which said laser structure is formed, said annealing temperature also being substantially less than the temperature necessary to comparably anneal said material in the absence of said simultaneous ion implantation, to give said lateral active region portions a larger bandgap and lower refractive index than the remainder of said active region which is generally aligned substantially with the lateral bounds of said ridge, and thereby provide lateral charge carrier and optical confinement for said remaining active region.

16. The method of claim 15, wherein said laser structure is formed on a semiconductor substrate, further comprising the step of growing semiconductor layers for additional circuit devices on said substrate prior to said implantation/heating step, at least some of said additional circuit devices being subject to performance degradation when heated to temperatures in excess of said threshold for temperature degradation.

17. The method of claim 15, wherein said ridge is used as an implantation mask for said active region during implantation of said ions.

18. The method of claim 15, wherein said ridge is formed by covering the ridge with an etch mask and etching away surrounding material, and said etch mask on said ridge is used as an implantation mask for said active region during implantation of said ions.

19. The method of claim 15, wherein said active region is buried to a depth less than about 0.5 microns below the top surface of said charge carrier confining material.

20. The method of claim 19, wherein said active region is buried to a depth of about 0.2–0.3 microns below the top surface of said charge carrier confining material.

21. The method of claim 15, wherein said laser structure is formed from gallium arsenide, and said annealing temperature is in the range of about 500°–550° C.

22. The method of claim 15, wherein said laser structure is formed from indium phosphide, and said annealing temperature is about 400° C.

* * * * *